(12) United States Patent
Mayer et al.

(10) Patent No.: US 8,623,193 B1
(45) Date of Patent: *Jan. 7, 2014

(54) METHOD OF ELECTROPLATING USING A HIGH RESISTANCE IONIC CURRENT SOURCE

(75) Inventors: Steven T Mayer, Lake Oswego, OR (US); Jonathan D. Reid, Sherwood, OR (US)

(73) Assignee: Novellus Systems, Inc., Fremont, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 13/110,759

(22) Filed: May 18, 2011

Related U.S. Application Data

(60) Continuation of application No. 12/578,310, filed on Oct. 13, 2009, now Pat. No. 7,967,969, which is a division of application No. 11/040,359, filed on Jan. 20, 2005, now Pat. No. 7,622,024.

(60) Provisional application No. 60/580,433, filed on Jun. 16, 2004.

(51) Int. Cl.
    *C25D 7/12*     (2006.01)
    *C25D 21/12*    (2006.01)
    *H01L 21/768*   (2006.01)

(52) U.S. Cl.
    USPC ........... 205/96; 204/DIG. 7; 205/97; 205/123

(58) Field of Classification Search
    USPC .................. 205/96, 97; 204/DIG. 7
    See application file for complete search history.

(56) References Cited

U.S. PATENT DOCUMENTS

| | | |
|---|---|---|
| 3,652,442 A | 3/1972 | Powers et al. |
| 3,706,651 A | 12/1972 | Leland |
| 3,862,891 A | 1/1975 | Smith |

(Continued)

FOREIGN PATENT DOCUMENTS

| | | |
|---|---|---|
| CN | 201130081716.6 | 4/2012 |
| EP | 0037325 | 3/1981 |

(Continued)

OTHER PUBLICATIONS

Fang et al., "Uniform Copper Electroplating on Resistive Substrates," Abs. 167, $205^{th}$ Meeting, © 2004 The Electrochemical Society, Inc., 1 page.

(Continued)

*Primary Examiner* — Patrick Ryan
*Assistant Examiner* — William Leader
(74) *Attorney, Agent, or Firm* — Weaver Austin Villeneuve & Sampson LLP

(57) ABSTRACT

A substantially uniform layer of a metal is electroplated onto a work piece having a seed layer thereon. This is accomplished by employing a "high resistance ionic current source," which solves the terminal problem by placing a highly resistive membrane (e.g., a microporous ceramic or fretted glass element) in close proximity to the wafer, thereby swamping the system's resistance. The membrane thereby approximates a constant current source. By keeping the wafer close to the membrane surface, the ionic resistance from the top of the membrane to the surface is much less than the ionic path resistance to the wafer edge, substantially compensating for the sheet resistance in the thin metal film and directing additional current over the center and middle of the wafer.

17 Claims, 8 Drawing Sheets

(56) References Cited

U.S. PATENT DOCUMENTS

| | | |
|---|---|---|
| 4,033,833 A | 7/1977 | Bestel et al. |
| 4,082,638 A | 4/1978 | Jumer |
| 4,240,886 A | 12/1980 | Hodges et al. |
| 4,272,335 A | 6/1981 | Combs |
| 4,304,641 A | 12/1981 | Grandia et al. |
| 4,389,297 A | 6/1983 | Korach |
| 4,409,339 A | 10/1983 | Matsuda et al. |
| 4,469,564 A | 9/1984 | Okinaka et al. |
| 4,545,877 A | 10/1985 | Hillis |
| 4,604,177 A | 8/1986 | Sivilotti |
| 4,604,178 A | 8/1986 | Flegener et al. |
| 4,605,482 A | 8/1986 | Shiragami et al. |
| 4,696,729 A | 9/1987 | Santini |
| 4,828,654 A | 5/1989 | Reed |
| 4,906,346 A | 3/1990 | Hadersbeck et al. |
| 4,931,149 A | 6/1990 | Stierman et al. |
| 4,933,061 A | 6/1990 | Kulkarni et al. |
| 4,988,417 A | 1/1991 | DeYoung |
| 5,035,784 A | 7/1991 | Anderson et al. |
| 5,039,381 A | 8/1991 | Mullarkey |
| 5,078,852 A | 1/1992 | Yee et al. |
| 5,096,550 A | 3/1992 | Mayer et al. |
| 5,146,136 A | 9/1992 | Ogura et al. |
| 5,156,730 A | 10/1992 | Bhatt et al. |
| 5,162,079 A | 11/1992 | Brown |
| 5,217,586 A | 6/1993 | Datta et al. |
| 5,316,642 A | 5/1994 | Young, Jr. et al. |
| 5,332,487 A | 7/1994 | Young et al. |
| 5,368,711 A | 11/1994 | Poris |
| 5,391,285 A | 2/1995 | Lytle et al. |
| 5,421,987 A | 6/1995 | Tzanavaras et al. |
| 5,443,707 A | 8/1995 | Mori |
| 5,472,592 A | 12/1995 | Lowery |
| 5,476,578 A | 12/1995 | Forand |
| 5,498,325 A | 3/1996 | Nishimura et al. |
| 5,516,412 A | 5/1996 | Andricacos et al. |
| 5,567,300 A | 10/1996 | Datta et al. |
| 5,660,699 A | 8/1997 | Saito et al. |
| 5,723,028 A | 3/1998 | Poris |
| 5,744,019 A | 4/1998 | Ang |
| 5,935,402 A | 8/1999 | Fanti |
| 6,004,440 A | 12/1999 | Hanson et al. |
| 6,027,631 A | 2/2000 | Broadbent |
| 6,080,291 A | 6/2000 | Woodruff et al. |
| 6,106,687 A | 8/2000 | Edelstein |
| 6,126,798 A | 10/2000 | Reid et al. |
| 6,132,587 A | 10/2000 | Jorne et al. |
| 6,132,805 A | 10/2000 | Moslehi |
| 6,179,983 B1 | 1/2001 | Reid et al. |
| 6,193,860 B1 | 2/2001 | Weling |
| 6,228,231 B1 | 5/2001 | Uzoh |
| 6,251,255 B1 | 6/2001 | Copping et al. |
| 6,261,433 B1 | 7/2001 | Landau |
| 6,368,475 B1 | 4/2002 | Hanson et al. |
| 6,391,166 B1 | 5/2002 | Wang |
| 6,391,188 B1 | 5/2002 | Goosey |
| 6,395,152 B1 | 5/2002 | Wang |
| 6,398,926 B1 | 6/2002 | Mahneke |
| 6,402,923 B1 | 6/2002 | Mayer et al. |
| 6,497,801 B1 | 12/2002 | Woodruff et al. |
| 6,521,102 B1 | 2/2003 | Dordi |
| 6,527,920 B1 | 3/2003 | Jackson et al. |
| 6,551,483 B1 | 4/2003 | Mayer et al. |
| 6,627,051 B2 | 9/2003 | Berner et al. |
| 6,632,335 B2 | 10/2003 | Kunisawa et al. |
| 6,755,954 B2 | 6/2004 | Mayer et al. |
| 6,773,571 B1 | 8/2004 | Mayer et al. |
| 6,821,407 B1 | 11/2004 | Reid et al. |
| 6,890,416 B1 | 5/2005 | Mayer et al. |
| 6,919,010 B1 | 7/2005 | Mayer |
| 6,921,468 B2 | 7/2005 | Graham et al. |
| 6,964,792 B1 | 11/2005 | Mayer et al. |
| 7,070,686 B2 * | 7/2006 | Contolini et al. ............... 205/96 |
| 7,169,705 B2 | 1/2007 | Ide et al. |
| D544,452 S | 6/2007 | Nakamura et al. |
| D548,705 S | 8/2007 | Hayashi |
| D552,565 S | 10/2007 | Nakamura et al. |
| D553,104 S | 10/2007 | Oohashi et al. |
| D587,222 S | 2/2009 | Sasaki et al. |
| 7,622,024 B1 | 11/2009 | Mayer et al. |
| 7,641,776 B2 | 1/2010 | Nagar et al. |
| D609,652 S | 2/2010 | Nagasaka et al. |
| D609,655 S | 2/2010 | Sugimoto |
| 7,670,465 B2 | 3/2010 | Yang et al. |
| D614,593 S | 4/2010 | Lee et al. |
| 7,837,841 B2 | 11/2010 | Chen et al. |
| 7,854,828 B2 | 12/2010 | Reid et al. |
| 7,935,240 B2 | 5/2011 | Singh et al. |
| 7,967,969 B2 | 6/2011 | Mayer et al. |
| D648,289 S | 11/2011 | Mayer et al. |
| 8,308,931 B2 | 11/2012 | Reid et al. |
| 8,475,636 B2 | 7/2013 | Mayer et al. |
| 8,475,644 B2 | 7/2013 | Mayer et al. |
| 2002/0017456 A1 | 2/2002 | Graham et al. |
| 2002/0020627 A1 | 2/2002 | Kunisawa et al. |
| 2002/0119671 A1 | 8/2002 | Lee |
| 2002/0125141 A1 | 9/2002 | Wilson et al. |
| 2003/0029527 A1 | 2/2003 | Yajima et al. |
| 2003/0038035 A1 | 2/2003 | Wilson et al. |
| 2003/0102210 A1 | 6/2003 | Woodruff et al. |
| 2003/0201166 A1 | 10/2003 | Zheng et al. |
| 2004/0149584 A1 | 8/2004 | Nagai et al. |
| 2005/0145499 A1 | 7/2005 | Kovarsky et al. |
| 2006/0243598 A1 | 11/2006 | Singh et al. |
| 2007/0029193 A1 | 2/2007 | Brcka |
| 2007/0068819 A1 | 3/2007 | Singh et al. |
| 2007/0238265 A1 | 10/2007 | Kurashina et al. |
| 2010/0032304 A1 | 2/2010 | Mayer et al. |
| 2010/0032310 A1 | 2/2010 | Reid et al. |
| 2010/0044236 A1 | 2/2010 | Mayer et al. |
| 2011/0031112 A1 | 2/2011 | Birang et al. |
| 2012/0000786 A1 | 1/2012 | Mayer et al. |

FOREIGN PATENT DOCUMENTS

| | | |
|---|---|---|
| JP | 59-162298 | 9/1984 |
| JP | 09-53197 | 2/1997 |
| JP | 20021316887 | 11/2001 |
| JP | 2003-268591 | 9/2003 |
| KR | 10-0707121 | 4/2007 |
| KR | 0657600 | 8/2012 |
| TW | D148167 | 7/2012 |
| WO | WO/9941434 | 8/1999 |
| WO | WO2010/144330 | 12/2010 |

OTHER PUBLICATIONS

Steven T. Mayer, "Uniform Electroplating of Thin Metal Seeded Wafers Using Rotationally Asymmetric Variable Anode Correction", U.S. Appl. No. 10/916,374, filed Aug. 10, 2004.

Mayer et al., "Copper Electroplating Method and Apparatus", U.S. Appl. No. 10/318,497, filed May 10, 2000.

Mayer et al., Electrochemical Treatment of Integrated Circuit Substrates Using Concentratic Anodes and Variable Field Shaping Elements, U.S. Appl. No. 10/116,077, filed Apr. 2, 2002.

U.S. Office Action for U.S. Appl. No. 11/040,359 mailed Oct. 26, 2007.

Final Office Action for U.S. Appl. No. 11/040,359 mailed Jul. 25, 2008.

U.S. Office Action for U.S. Appl. No. 11/040,359 mailed Jan. 8, 2009.

Notice of Allowance and Allowed Claims for U.S. Appl. No. 11/040,359 mailed Jul. 20, 2009.

Malmstadt et al. "Microcomputers and Electronic Instrumentation: Making the Right Connections" American Chemical Society (1994) p. 255.

International Search Report and Written Opinion for Application No. PCT/US2010/037520 dated Jan. 12, 2011.

Mayer et al., "Method and Apparatus for Electroplating", Novellus Systems, Inc., U.S. Appl. No. 12/481,503, filed Jun. 9, 2009.

Mayer et al., "Method and Apparatus for Electroplating," Novellus Systems, Inc., U.S. Appl. No. 12/606,030, filed Oct. 26, 2009.

(56) References Cited

OTHER PUBLICATIONS

US Office Action dated Oct. 6, 2010, issued in U.S. Appl. No. 12/578,310.
US Notice of Allowance, dated Mar. 4, 2011, issued in U.S. Appl. No. 12/578,310.
US Office Action dated Sep. 19, 2011, issued in U.S. Appl. No. 12/291,356.
US Final Office Action dated Feb. 27, 2012, issued in U.S. Appl. No. 12/291,356.
US Notice of Allowance dated Jul. 27, 2012, issued in U.S. Appl. No. 12/291,356.
US Office Action dated Jun. 24, 2011, issued in U.S. Appl. No. 12/481,503.
US Final Office Action dated Mar. 1, 2012, issued in U.S. Appl. No. 12/481,503.
US Office Action dated Jul. 9, 2012, issued in U.S. Appl. No. 12/481,503.
US Final Office Action dated Dec. 19, 2012 issued in U.S. Appl. No. 12/481,503.
US Office Action dated Jun. 24, 2011, issued in U.S. Appl. No. 12/606,030.
US Final Office Action dated Mar. 1, 2012, issued in U.S. Appl. No. 12/606,030.
US Office Action dated Jun. 28, 2012, issued in U.S. Appl. No. 12/606,030.
US Office Action dated Jul. 13, 2012, issued in U.S. Appl. No. 12/606,030.
US Final Office Action dated Dec. 17, 2012 issued in U.S. Appl. No. 12/606,030.
US Notice of Allowance dated Aug. 10, 2011, issued in Design U.S. Appl. No. 29/377,521.
CN Office Action dated Jul. 19, 2011, issued in Application No. 201130081716.6.
TW Office Action dated Nov. 28, 2011, issued in Application No. 100301923.
KR Office Action dated Apr. 20, 2012, issued in Application No. 2011-0012881.
"Release of Sabre™ electrofill tool with HRVA by Novellus Systems, Inc.", dated prior to the filing date of the instant application (3 pages).
US Notice of Allowance dated Mar. 1, 2013 issued in U.S. Appl. No. 12/481,503.
US Notice of Allowance dated Mar. 1, 2013 issued in U.S. Appl. No. 12/606,030.
"Release of Sabre™ electrofill tool with HRVA by Novellus Systems, Inc." no earlier than Aug. 2005. (3 pages).

\* cited by examiner

METHOD OF ELECTROPLATING USING A HIGH RESISTANCE IONIC CURRENT SOURCE

CROSS REFERENCE TO RELATED APPLICATIONS

This application is a continuation of U.S. patent application Ser. No. 12/578,310, naming Steven T. Mayer and Jonathan D. Reid as inventors, filed Oct. 13, 2009, and titled, "HIGH RESISTANCE IONIC CURRENT SOURCE," which is a division of U.S. patent application Ser. No. 11/040,359 (now U.S. Pat. No. 7,622,024) naming Steven T. Mayer and Jonathan D. Reid as inventors, filed Jan. 20, 2005, and titled, "HIGH RESISTANCE IONIC CURRENT SOURCE," which claims priority under 35 USC 119(e) from U.S. Provisional Application No. 60/580,433, naming Steven T. Mayer and Jonathan D. Reid as inventors, filed Jun. 16, 2004, and titled, "HIGH RESISTANCE IONIC CURRENT SOURCE," which are herein incorporated by reference in their entirety. This application is related to U.S. patent application Ser. No. 10/318,497, filed Dec. 11, 2002, naming Steven T. Mayer et al. as inventors, and titled, "COPPER ELECTROPLATING METHOD AND APPARATUS," to U.S. patent application Ser. No. 09/706,272 (now U.S. Pat. No. 6,527,920, issued Mar. 4, 2003), naming Steven T Mayer et al. as inventors and titled "COPPER ELECTROPLATING METHOD AND APPARATUS," to U.S. Provisional Application No. 60/203,432, naming Steven T Mayer et al. as inventors, filed May 10, 2000, and titled "METHODS, MATERIALS AND APPARATUS FOR IMPROVED COPPER ELECTROPLATING." This application is also related to U.S. application Ser. No. 10/916,374, naming Steven T. Mayer as inventor, filed Aug. 10, 2004, titled "UNIFORM ELECTROPLATING OF THIN METAL SEEDED WAFERS USING ROTATIONALLY ASYMMETRIC VARIABLE ANODE CORRECTION." Each of these patent documents is incorporated herein by reference for all purposes.

BACKGROUND

The present invention pertains to methods and apparatus for electroplating metal onto a work piece. More specifically, the invention pertains to methods and apparatus for controlling the electrical resistance and current flow characteristics in an electrolyte environment encountered by the work piece during electroplating.

The transition from aluminum to copper required a change in process "architecture" (to damascene and dual-damascene) as well as a whole new set of process technologies. One process step used in producing copper damascene circuits is the formation of a "seed-" or "strike-" layer, which is then used as a base layer onto which copper is electroplated ("electrofill"). The seed layer carriers the electrical plating current from the edge region of the wafer (where electrical contact is make) to all trench and via structures located across the wafer surface. The seed film is typically a thin conductive copper layer. It is separated from the insulating silicon dioxide or other dielectric by a barrier layer. The seed layer deposition process should yield a layer which has good overall adhesion, excellent step coverage (more particularly, conformal/continuous amounts of metal deposited onto the side-walls of an embedded structure), and minimal closure or "necking" of the top of the embedded feature.

Market trends of increasingly smaller features and alternative seeding processes drive the need for a capability to plate with a high degree of uniformity on increasingly thin seeded wafers. In the future, it is anticipated that the seed film may simply be composed of a plate-able barrier film, such as ruthenium, or a bilayer of a very thin barrier and copper (deposited, for example, by an atomic layer deposition (ALD) or similar process). These films present the engineer with an extreme terminal effect situation. For example, when driving a 3 amp total current uniformly into a 30 ohm per square ruthenium seed layer (a likely value for a 30-50 Å film) the resultant center to edge voltage drop in the metal will be over 2 volts. To effectively plate a large surface area, the plating tooling makes electrical contact to the conductive seed only in the edge region of the wafer substrate. There is not direct contact made to the central region of the substrate. Hence, for highly resistive seed layers, the potential at the edge of the layer is significantly greater than at the central region of the layer.

FIG. 1 is a schematic of an approximated equivalent electrical circuit for the problem. It is simplified to one dimension for clarity. The continuous resistance in the seed layer is represented by a set of finite (in this case four) parallel circuit elements. The in-film resistor elements $R_f$ represent the differential resistance from an outer radial point to a more central radial point on the wafer. The total current supplied at the edge, $I_t$ is distributed to the various surface elements, $I_1$, $I_2$, etc., scaled by the total path resistances with respect to all the other resistances. The circuits more centrally located have a larger total resistance because of the cumulative/additive resistance of the $R_f$ for those paths. Mathematically, the fractional current $F_i$ through any one of the surface element paths is $$F_i = \frac{I_i}{I_t} = \frac{Z_T}{Z_i} = \frac{\frac{1}{(iR_f + R_{ct,i} + Zw_i + R_{el,i})}}{\sum_1^n \frac{1}{iR_f + R_{ct,i} + Zw_i + R_{el,i}}} \quad (1)$$

where n is the total number of parallel paths that the circuit is divided into, i (sometime used as a subscript) refers to the $i^{th}$ parallel current path (from the edge terminal), t refers to the total circuit, I is current, $R_f$ is the resistance in the metal film between each element (constructed, for simplicity, to be the same between each adjacent element), $R_{ct}$ is the local charge transfer resistance, $Z_w$ is the local diffusion (or Warberg) impedance and $R_{el}$ is the electrolyte resistance. With this, $I_i$ is the current to through the $i^{th}$ surface element pathway, and $I_t$ is the total current to the wafer. The charge transfer resistance at each interfacial location is represented by a set of resistors $R_{ct}$ in parallel with the double layer capacitance $C_{dl}$, but for the steady state case does not effect the current distribution. The diffusion resistances, represented by the Warberg impedance (symbol $Z_w$) and the electrolyte resistance ($R_{el}$) are shown in a set of parallel circuit paths, all in series with the particular surface element circuit, give one of several parallel paths for the current to traverse to the anode. In practice, $R_{ct}$ and $Z_w$ are quite non-linear (depending on current, time, concentrations, etc.), but this fact does not diminish the utility of this model in comparing how the current art and this disclosure differ in accomplishing uniform current distribution. To achieve a substantially uniform current distribution, the fractional current should be the same, irrespective of the element position (i). When all terms other than the film resistance term, $R_f$, are relatively small, the current to the $i^{th}$ element is $$F = \frac{\frac{1}{i}}{\sum_{1}^{n} \frac{1}{i}} \quad (2)$$

Equation 2 has a strong i (location) dependence and results when no significant current distribution compensating effects are active. In the other extreme, when $R_{ct}$, $Z_w$, $R_{el}$ or the sum of these terms are greater than $R_f$, the fractional current approaches a uniform distribution; the limit of equation 1 as these parameters become large is F=1/n, independent of location i.

Classical means of improving plating non-uniformity draw upon (1) increase $R_{ct}$ through the use of copper complexing agents or charge transfer inhibitors (e.g., plating suppressors and levelers, with the goal of creating a large normal-to-the-surface voltage drop, making $R_f$ small with respect to $R_{ct}$) or (2) very high ionic electrolyte resistances (yielding a similar effect through $R_{el}$), (3) creating a significant diffusion resistance ($Z_w$), variations of plating current recipe to minimize voltage drop, or control of mass transfer rate to limit current density in areas of high interfacial voltage drop (U.S. Pat. Nos. 6,110,344; 6,074,544; 6,162,344).

These approaches have significant limitations related to the physical properties of the materials and the processes. Typical surface polarization derived by organic additives cannot create polarization in excess of about 0.5V (which is a relatively small value in comparison to seed layer voltage drop that must be compensated). Also, because the conductivity of a plating bath is tied to its ionic concentration and pH, decreasing the conductivity directly and negatively impacts the rate of plating and morphology of the plated material.

Beyond these classical approaches, a few newer approaches have been pursued to address the terminal effect problem. One class alters the effective ionic path resistance $R_{el}$ for different current path elements (i.e., it provides a non-uniform $R_{el}$ in the radial direction) in order to balance the resistance in the film with that external to the film as discussed in U.S. Pat. No. 6,126,798; 6,569,299; and U.S. Pat. No. 6,179,983 Some current shielding and concentric multiple anode source approaches fall into this solution class. See U.S. Pat. No. 6,773,571 issued to Mayer et al. on Aug. 10, 2004 and U.S. Pat. No. 6,402,923 issued to Mayer et al. on Jun. 11, 2002, both of which are incorporated herein by reference for all purposes. Another class utilizes a time averaging exposure effect (for example, with a rotating wafer and a current shield element) to, over time, plate the same thickness at all locations. In other words, the plating current is modified according to the time-averaged exposure that a rotating wafer "sees" the anode with a mask of a certain shape and size covering the work piece during a portion of the rotational period. See U.S. Pat. No. 6,027,631 issued to Broadbent et al. on Feb. 22, 2000 and U.S. application Ser. No. 10/916,374, naming Steven T. Mayer as inventor, filed Aug. 10, 2004, titled "UNIFORM ELECTROPLATING OF THIN METAL SEEDED WAFERS USING ROTATIONALLY ASYMMETRIC VARIABLE ANODE CORRECTION," which are incorporated herein by reference for all purposes.

While the approaches discussed above have proven useful, they have potential limitations such as (1) the inability to continuously (throughout the process) change the resistance compensation as appropriate when the thickness of the plated layer grows and thereby reduces the electronic resistance, (2) a high cost of implementation, and/or (3) mechanical limitations (e.g., excess number of moving parts in a corrosive bath, material compatibility limitations, or reliability). Furthermore, the above approaches are not all easily adaptable/integrateable to particularly desirable apparatus configurations such as microcell configurations, a newly developed and desirable class of plating cells. See US Patent Publication No. 2004/0065540 (Mayer et al.), titled "Liquid Treatment Using Thin Liquid Layer," and published Apr. 8, 2004, which is incorporated herein by reference for all purposes. See also U.S. patent application Ser. No. 10/739,822, naming Steven T. Mayer, et al. as inventors, filed Dec. 17, 2003, titled, "METHOD FOR PLANAR ELECTROPLATING," which is also incorporated herein by reference for all purposes.

What is needed therefore is an improved technique for uniform electroplating onto thin-metal seeded wafers, particularly wafers with large diameters (e.g. 300 mm).

SUMMARY

The present invention pertains to methods and apparatus for electroplating a substantially uniform layer of a metal onto a work piece having a seed layer thereon. This invention mitigates or eliminates the terminal problem by placing an ionically resistive element (e.g., a microporous ceramic or fretted glass membrane) in close proximity to the work piece, thereby swamping the system's resistance. The resistive element thus approximates a constant current source. By keeping the work piece close to the resistive element surface, the ionic resistance from the top of the element to the surface is much less than the ionic path resistance to the work piece edge, substantially compensating for the sheet resistance in the thin metal film and directing a significant amount of current over the center of the work piece. The deposition profiles thus obtained are smoother than those obtained by other approaches (monotonic), and as the film thickens, the system naturally (without changing power settings or moving elements) leads to a progressively more uniform current distribution. This approach provides an improved deposition profile without significantly increasing overall system resistance. The combination of a resistive element with either a shielding member, located under the membrane, or a set of dynamically operable anodes with focusing elements leading up to the bottom of the membrane, and/or a rotationally asymmetric anode approach, allows additional control over the center to edge deposition profiles and dynamic control.

One aspect of the invention provides methods of electroplating a substantially uniform layer of metal onto a thin conductive seed layer of a work piece surface having edge regions around a center region. The method may be characterized by the following operations: (a) making electrical connection to the seed layer at one or more locations on the edge regions, but not at the center region; (b) positioning the work piece in a plating cell having an ionically resistive porous membrane substantially co-extensive with the seed layer; and (c) delivering current through the plating cell via the electrical connections to the seed layer. The resistive membrane is oriented to have one surface facing the work piece surface and an opposite surface facing an anode in the plating cell, such that the surface to be plated is located within about 5 millimeters or less of the porous membrane. In this arrangement, the membrane introduces a circuit resistance in an ionic current path of the plating cell, which compensates for a potential drop in the seed layer between edge regions and the center regions to thereby promote uniform plating across the seed layer on the work piece surface.

Preferably, the membrane has a porosity of between about 0.5% and 25%, more preferably about 5% or less. As indicated the membrane may be placed in close proximity to the work piece, preferably within about 1 to 5 millimeters. The distance may scale with the size of the work piece to be plated. For example, when the surface of the work piece is substantially flat and circular (e.g., a semiconductor wafer), and the surface may separated from the membrane by a distance of not greater than about 5% (more preferably about 2%) of the diameter of the work piece's circular region.

Preferably, the thickness of the porous membrane is between about 5 and 25 millimeters. Of course, this thickness depends upon the porosity, location and material of construction for the membrane. In certain embodiments, the thickness should be chosen so that the membrane does not increase the overall ionic resistance in the plating cell beyond that needed to obtain the desired level of uniformity. In one example, the presence of the porous membrane increases the ionic resistance between the anode and the work piece by no more than about 5 ohms when the work piece is a 200 or 300 millimeter semiconductor wafer.

As indicated, the invention may be coupled with other approaches to controlling the plating deposition profile. For example, the current may be delivered through two separate anode segments, controlled independently of one another. In one embodiment, these are arranged concentrically with respect to one another. In another embodiment, at least one anode segment is azimuthally asymmetric with respect to the work piece surface. In yet another approach, the plating cell comprises an iris positioned to restrict ionic current proximate the edge regions of the work piece surface.

Another aspect of the invention pertains to apparatus for electroplating a substantially uniform layer of metal onto a conductive seed layer of a work piece surface having edge regions around a center region. The apparatus may be characterized by the following features: (a) a plating chamber; (b) a work piece holder for holding the work piece in the plating chamber at a position in alignment with an anode; (c) electrical contacts arranged to make electrical connection to the seed layer at one or more locations on the edge regions; and (d) an ionically resistive porous membrane positioned to have one surface facing the work piece surface, and located within about 5 millimeters of said work piece surface, and an opposite surface facing the anode during plating in the plating chamber.

These and other features and advantages of the present invention will be described in more detail below with reference to the associated drawings.

DETAILED DESCRIPTION

Introduction

Figure 1:
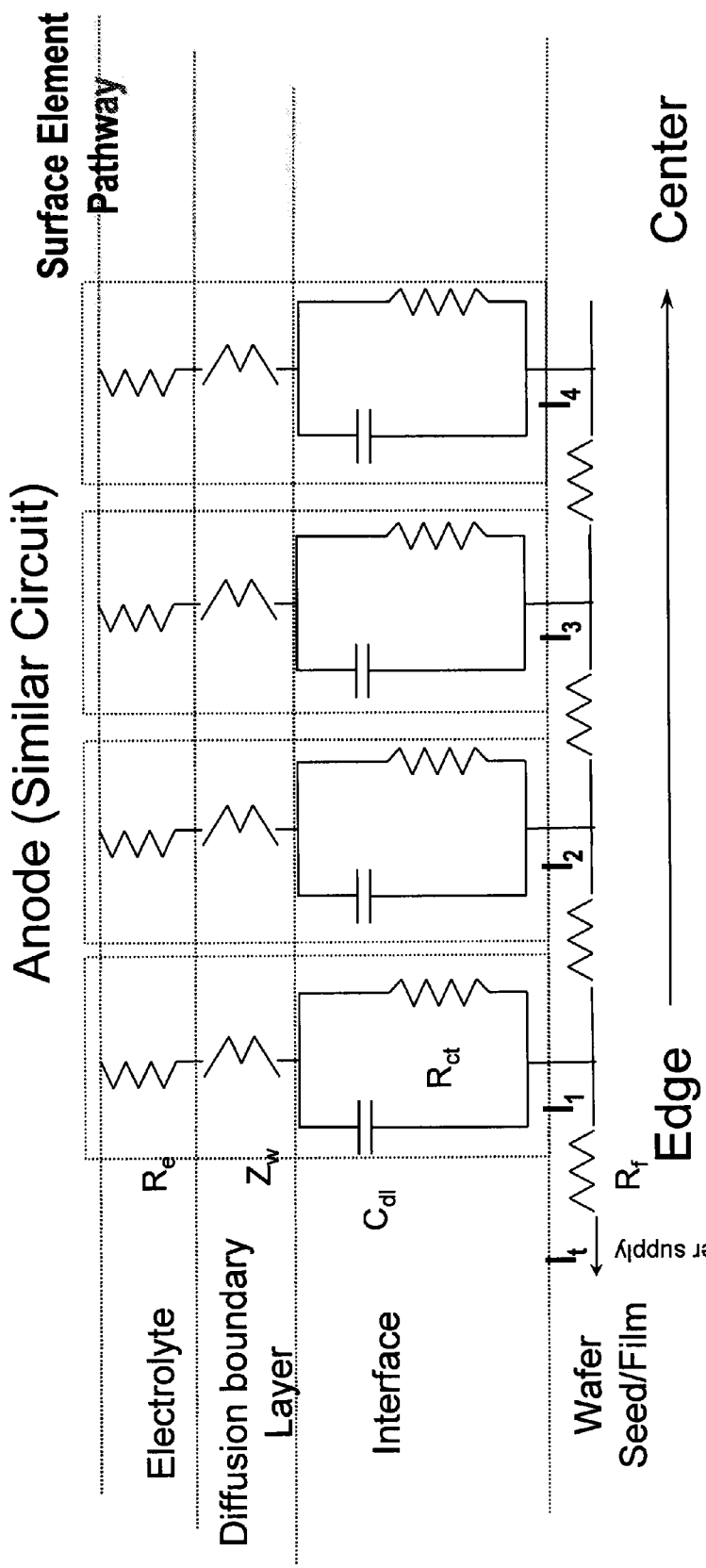
FIG. 1 is a schematic diagram depicting an equivalent circuit for electroplating on a thin seed layer.

This invention relates to electroplating methods and apparatus for use in integrated circuit (IC) fabrication and other applications. More specifically it relates to the use a resistive ion current source hardware set and process. Generally, the technology employs a low porosity membrane or other barrier to ionic conductivity located between the anode and the work piece, with the membrane positioned in close proximity to the plating surface, typically separated by about 1 to 5 mm. This use of a resistive membrane compensates for the preferential edge plating associated with electrical resistance and voltage drop across the wafer by adding a large circuit resistance to the ionic current path. The approach is designed to gives adequate uniformity at the beginning of the process (when the wafer film resistance is highest). As the metallic film is plated, the sheet resistance of the film decreases and the plating rate uniformity improves.

The apparatus and processes of this invention enable a simple, low cost, reliable method for the production of uniform electroplated film deposits on thin metal seeded work piece. More specifically, this invention enables superior uniformity control of work pieces having (1) very thin "seed" layers with sheet resistances of about 1 ohm/sq or greater, (2) large diameters (e.g., 300 mm semiconductor wafers), (3) high feature densities (e.g., at least about 5000 features per cm), and (4) small feature sizes (e.g., average size of at most about 95 nm).

While the apparatus of this invention employs plating cells in which electrical contact is made in the edge region of the wafer substrate, it is not limited to any general class of plating apparatus. One suitable example is the SABRE™ clamshell electroplating apparatus available from Novellus Systems, Inc. of San Jose, Calif. and described in U.S. Pat. Nos. 6,156, 167, 6,159,354, 6,193,859, and 6,139,712, and in U.S. patent application Ser. No. 10/010,954, filed Nov. 30, 2001, titled "Improved Clamshell Apparatus with Dynamic Uniformity Control," each of which is herein incorporated by reference in its entirety. The invention is also applicable to plating hardware in which the anode or virtual anode (e.g., top of the membrane) and the wafer lay in close proximity to one another, such as in a "microcell" or "microgap" configuration. See e.g., US Patent Publication No. 2004/0065540 (Mayer et al.), which was previously incorporated by reference.

In some embodiments, the invention combines the resistive membrane with another mechanism for compensating the terminal effect. For example, the inventive apparatus may employ set of concentric anodes or a dynamic movable iris to direct additional current to the center of the work piece. Other compensating mechanisms that may be employed together with the resistive membrane include dynamic shielding and rotationally asymmetric anodes. Use of these mechanisms allows one to "turn down" the compensation as the plated layer grows thicker and thereby reduces the terminal effect.

Various terms of art are used in this description of this invention. These terms should be construed broadly. Some relevant considerations follow.

For example, the invention is described in terms of electroplating on wafers, particularly semiconductor wafers undergoing damascene processing. However, the work piece is not limited to such wafers. The work piece may be of various shapes, sizes, and materials. In addition to semiconductor wafers, other work pieces that may take advantage of this invention include printed circuit boards, flat panel displays, and the like. In this document, the term "wafer" will be used interchangeably with "wafer substrate", and "substrate." One skilled in the art would understand that these terms could refer to a semiconductor (e.g. silicon) wafer during any of many stages of integrated circuit fabrication thereon.

Wafer Holder—A wafer holder generally describes a component that immobilizes a wafer and has positioning components for moving the wafer, e.g., rotation, immersion, and that has circuitry for applying an electrical potential to the wafer via a conductive layer thereon. An exemplary wafer holder is the Clamshell apparatus available from Novellus Systems, Inc. of San Jose, Calif. A detailed description of the clamshell wafer holder is provided in U.S. Pat. Nos. 6,156,167, 6,159,354, 6,193,859, and 6,139,712, each of which is incorporated herein by reference for all purposes. In a microcell reactor, a mechanical or vacuum chuck may be employed to hold the wafer. This is described in the above-referenced US Patent Publication No. 2004/0065540.

Seed Layer—A seed layer generally refers to a thin conductive layer on a work piece through which current is passed to effect, for example, electroplating. Frequently, seed layers of the invention will be copper layers on wafers, however, the invention is not so limited. Layers of other materials such as ruthenium and some conductive barrier materials may be employed as well. The seed layer thickness is generally a function of the technology node being implemented. In many situations, the seed layer will have a thickness of between about 30 and 1000 Angstroms.

Plating Cell

The apparatus of this invention is not limited in use to a particular electroplating tool design or plating chemistry, though certain designs for the tool and chemistry are described herein. The porous membrane and plating chamber should be made of materials that are substantially resistance to corrosion or attack from the particular plating solution being used. But otherwise, many different designs may be employed.

Figure 2:
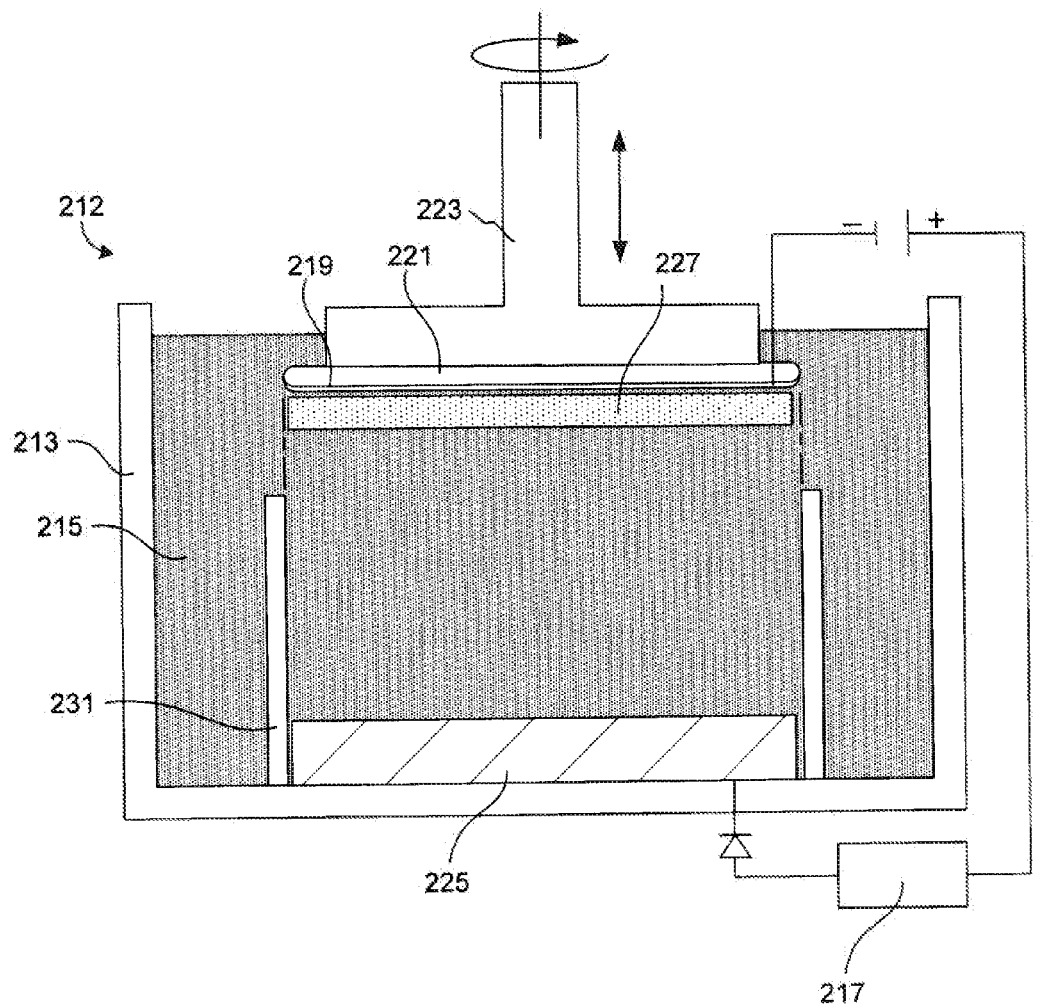
FIG. 2 is a cross-section depicting a plating cell suitable for this invention.

FIG. 2 is a simplified cross-section of a plating cell, 212, in accordance with one embodiment of this invention. Plating cell 212 has a vessel 213, for holding electrolyte 215 (preferably containing copper ions for plating copper onto a seed layer). A wafer holder 223 holds a wafer 221, which has a seed layer 219 thereon. In a typical damascene process, seed layer 219 is a copper seed layer. A circuit 217 controls the plating current to an anode 225. In one example, such a circuit employs diodes to ensure unidirectional current flow. As shown, anode 225 is positioned in the bottom of vessel 213 and occupies a region within a partially closed anode chamber wall 231. Plating cell 212 also includes an ionically resistive member 227 interposed between the anode 225 and wafer 221. It is shaped and sized to correspond, at least roughly, with the shape and size of wafer 221. It is also oriented to be parallel or substantially parallel (within a few degrees) to the surface of wafer 221. As shown, resistive member 227 is located in close proximity to waver 221.

Wafer holder 223 is capable of positioning wafer 221 in close proximity to the topmost portion of the focusing elements. Preferably the distance between the top surface of resistive member 227 and the wafer is about 10 millimeters or less during plating, more preferably about 1 to 5 millimeters. Preferably the walls of at least the anode chamber are between about 0.1 and 5 millimeters thick, more preferably between about 0.25 and 1 millimeters thick. Similar thickness ranges are appropriate for all the focusing element walls in the reactor.

Plating cells of the invention can include a variety other features not shown in FIG. 2. The particular application and apparatus context will dictate the use of such other features. As examples, the apparatus may include flow flutes configured to distribute the electrolyte flow between the area encompassed by a focusing element for the primary asymmetric anode, and areas encompassed by focusing elements for one or more other asymmetric anodes. In other embodiments, the apparatus includes a shielding element configured to shield a circumferential edge portion of the wafer from plating current during electroplating. Such shielding elements include, for example, a perforated ring shield proximate to the topmost portion of the anode chamber wall and/or a shielding element associated with the wafer holder.

The anodes used with this invention can be of either an inert or consumable type. The reactions of the consumable type (also referred to as active anodes) for plating copper are simple and balanced (no overall depletion or generation of new species). Copper ions in solution are reduced at the cathode and removed from the electrolyte, simultaneously as copper is oxidized at the anode and copper ions added to the electrolyte. The inert type (also referred to as "dimensionally stable" and non-reactive) provides unbalanced reactions and copper ions (or ions of any other metal being plated) must be added to plating solution. Various electrolyte formulations may be employed in either reactor. In addition to a salt of the metal to be plated (e.g., copper sulfate), many electrolytes contain an acid such as sulfuric acid. Other additives conventionally used in electroplating may also be employed.

The design and placement of the resistive element in the plating cell should be chosen to balance at least two considerations: improved plating uniformity across the face of the work piece and minimal increase in overall resistance within the plating cell. The primary goal is to introduce ionic current resistance between the work piece and the anode in a manner that promotes more uniform current distribution across the work piece surface. This goal may be achieved by carefully choosing various membrane characteristics including the membrane porosity, materials of construction, membrane thickness, and placement with respect to the work piece.

Overall, the resistive element will be ionically conductive, but not nearly as conductive as the electrolyte itself. In some embodiments, the resistive element is constructed from a material that is an ionic insulator. In such embodiments, limited ionic conduction is provided by introducing pores into the element. In alternative embodiments, the resistive element is constructed from a porous or non-porous material that is itself a weak ionic conductor (e.g., "Naphion" from DuPont Corporation of Wilmington, Del.). In all cases, the element will allow passage of some ionic current, but does so only when introducing significant ionic resistance. Generally, the element is engineered to have an appropriate ionic resistivity (via porosity and thickness), and positioned to drive the effect (e.g., less than 5 mm separation from the work piece, depending on the solution resistivity and practical limitations). Examples of ionically resistive materials for use in the resistive elements include electrolyte filled microporous ceramic, sintered silica (fretted glass), inorganic or organic gels and aerogels and sintered plastics (e.g., "Porex" porous plastics available from Porex Corporation of Fairburn, Ga. Example of ionically conductive materials with substantially higher resistance than the plating solution resistance include "Naphion" and other similar proton exchange membranes. As indicated, the material should be compatible with the chosen electrolyte and should resist corrosion or other degradation over many hours of electroplating. In many embodiments, the material is a solid. But it may be present in other phases as well; e.g., as a gel.

If a porous resistive element is employed, the porosity should be set to a low enough value that the ionic resistance of the element is significant. The optimal porosity will depend on the type of material employed (i.e., ionic conductor or insulator), the number and extent of the tortuous paths of pores, as well as the thickness of the element. If a relatively thin element is employed, then the porosity should be kept low. The same is true when an ionic conductor is employed. That is, when the material used to construct the element is an ionic conductor, then the porosity should remain relatively low (in comparison to the case where the resistive element is constructed from an ionic insulator). Note that for ionic insulators, porosity may be determined by the fractional superficial conductance of the region occupied by the membrane with respect to the specific conductance of the electrolyte within the membrane. In a specific embodiment employing ionic insulators of about 5 to 30 millimeters in thickness, the porosity is about 2% to 10% (e.g., about 5%).

The thickness of the resistive element also affects its total ionic resistance.

Thicker elements provide greater resistance for a given material and porosity. However, if the membrane is too thick it may become incompatible with the design of the plating cell. In some embodiments, the thickness of the element is preferably between about 5 millimeters and 30 millimeters. Obviously, the optimal thickness is dependent on other characteristics of the element (e.g., porosity and intrinsic conductivity) as well as the design of the plating cell.

Another important design parameter is the distance between the upper edge of the membrane and the work piece plating surface. For embodiments employing semiconductor wafers, the separation distance is preferably about 5 millimeters or less, more preferably about 1-5 millimeters. In another characterization, the separation distance is preferably less than about 5% of the wafer diameter, more preferably less than about 2% of the wafers diameter (e.g., less than about 6 mm below the wafer for a 300 mm wafer).

While the ionically resistive element, when properly placed, can lead to significant improvements in current distribution, various physical and process constraints may limit its application. For example, it may be desirable to use higher currents once some film has been plated, and if the membrane is too thick/resistive, the power or voltage required and/or the heat generated could be prohibitive. When this is the case, a thinner and/or less resistive membrane may be employed in conjunction with an additional compensation mechanism. Examples of these additional mechanisms include shielding elements and anodes designed to deliver additional current to the center region of the work piece.

One anode design that can be used for this purpose employs multiple anode segments, each of which can be separately controlled. The anode segments can be arranged so that greater current levels are provided from segments located proximate the center of the work piece. Concentrically arranged anode segments provide this capability. See U.S. Pat. No. 6,773,571 issued Aug. 10, 2004, which was previously incorporated by reference. In another embodiment, an azimuthally asymmetric anode is employed. The work piece rotates with respect to the anode to produce a time averaged current source that provides higher currents to the center of the work piece than to the edge regions. Examples of this apparatus are depicted in U.S. patent application Ser. No. 10/916,374 filed Aug. 10, 2004 by Mayer et al. and titled "Uniform Electroplating Of Thin Metal Seeded Wafers Using Rotationally Asymmetric Variable Anode Correction" which is incorporated herein by reference for all purposes.

Shielding mechanisms provide mechanisms for selectively modulating the electric field between the anode and the work piece to control or adjust the electrodeposition rate across the plating face of the work piece surface. Shield elements are made from non-conductive materials that are resistant to the plating electrolyte. Examples include polyolefins, fluoropolymers, etc. One approach employs an insulating iris that blocks passage of all ionic current in a region of the plating cell immediately beneath the periphery of the work piece surface. Such mechanisms are described in U.S. Pat. No. 6,402,923, previously incorporated by reference. Other approaches to shielding employ asymmetric elements that rotate with respect to the work piece to provide a time average current distribution that focuses additional current toward the center of the work piece as described in U.S. Pat. No. 6,027,631, previously incorporated by reference.

In the concentric anode embodiment, the anodes are preferably in close proximity to the membrane (preferably within a distance of about 5% or less of the wafer diameter, more preferably about 2% or less), or are accompanied by electrically and ionically insulating focusing cylinders that mate with the lower surface of the membrane. When an inner anode is then energized, current is preferentially directed to the center and cannot leak to the edge through a low resistance path. Current reaching the edge regions must either first transverse through the membrane and the through the electrolyte gap between the membrane and the wafer to the edge, or alone an angular lengthy path through the membrane. In one specific example, the plating cell provides a total system current of 6.9 A and has an inner anode 6.3 cm in radius, which initially supplies all the cell current from 100 mm below the wafer. The center cylinder in this case is 60 mm high, and is directing all its current up to the wafer 40 mm from the top of the cylinder.

Figure 3:
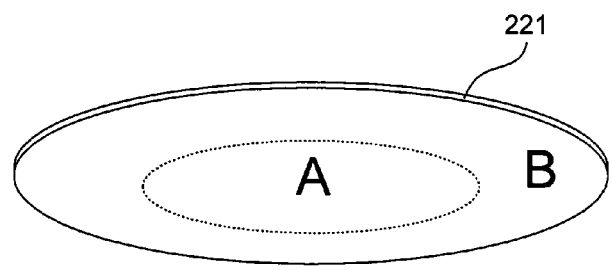
FIG. 3 is a perspective diagram showing inner and outer regions of the surface of a wafer showing regions associated with two concentric anodes that can be employed in an embodiment of this invention.
Figure 4:
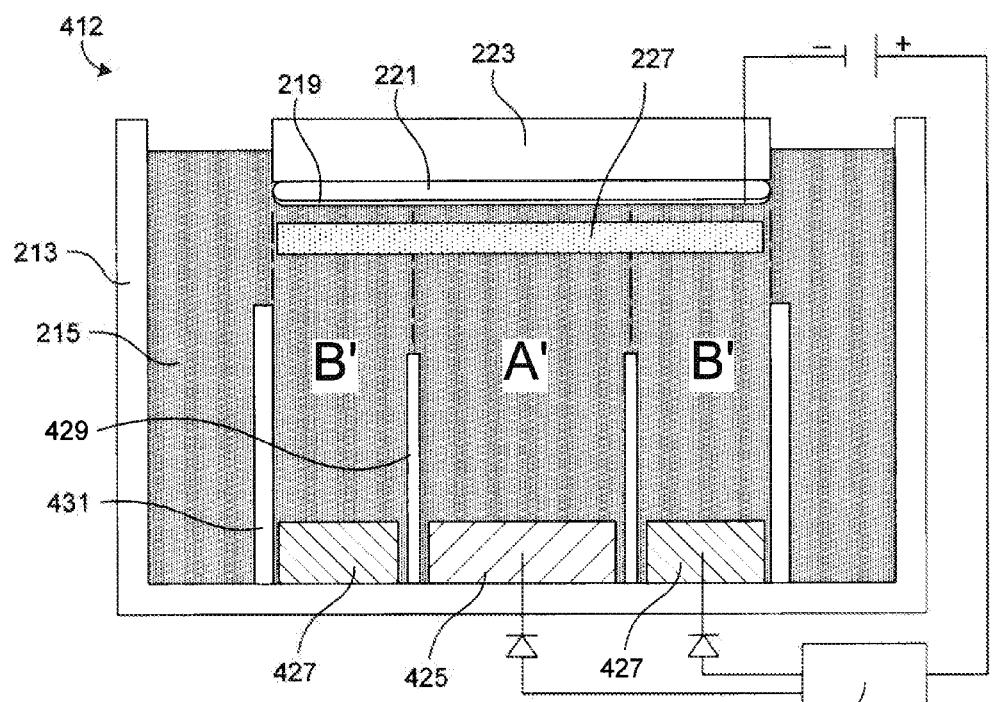
FIG. 4 is a cross-section depicting a plating cell having both a resistive membrane and concentric anodes in accordance with an embodiment of the invention.

FIGS. 3 and 4 illustrate a specific embodiment of the invention employing both a resistive membrane and concentrically arranged anode segments. FIG. 3 depicts a wafer 221, the front side of which has a seed layer thereon. The entire surface area of the seed layer can be conceptually divided into two regions, inner region A and outer region B. In this example, inner region A is a circular surface area and the center of the circular surface area is coincident with the center of wafer 221. Outer region B is an annular surface area defined by an outer circle, substantially coincident with the outermost edge of the wafer, and an inner circle of the same diameter as inner region B.

Current can be distributed between a plurality of anodes so that metal is deposited uniformly onto wafer 221. Initially, compensating for the terminal effect when the seed layer is thin, the current is distributed disproportionately so that inner area A of the wafer receives a larger fraction of the current in the electrolyte resulting from the potential applied to an anode (or anodes) proximate to the inner region. As the plated layer thickens and the terminal effect lessens, the plating current can be redistributed between the anodes.

FIG. 4 is a simplified cross-section of a plating cell 412 of the invention. Plating cell 412 has various features in common with plating cell 212 of FIG. 2. These include a vessel 213, for holding electrolyte 215, a wafer holder 223, and an ionically resistive element 227. However, anode 225 has been replaced with concentric anode segments 425 and 427. A circuit 417 distributes the plating current variably to each of the two anodes, 425 and 427. The circuit may employ diodes to ensure unidirectional current flow and lessen cross communication in the cell with respect to the anodes. In this example, inner anode 425 is a disk and outer anode 427 is a ring-shaped anode (preferably anodes of the invention are made of high purity copper). In one example, the work surface of the inner anode has a surface area that corresponds to between about 15 and 25 percent of the platable surface area of the wafer to be plated and the work surface of the outer anode has a surface area that corresponds to between about 75 and 85 percent of the platable surface area.

In this example, anodes 425 and 427 are positioned in the bottom of vessel 213 such that there is sufficient space for focusing cylinders 429 and 431. Focusing elements such as these cylinders are effective in aiding methods of shaping current density in the electrolyte. The focusing elements provide "virtual" current sources or "virtual anodes" at the cylinder openings, which are mathematically and physically similar to having an actual anode located at the cylinder openings. Preferably focusing cylinders of the invention are made, at least in part, of insulative materials. Preferred insulative materials include at least one of plastic, nanoporous ceramic, and glass.

Inner focusing cylinder 429 is used to focus current in electrolyte 215 arising from closure of the cell circuit between the cathode (seed layer 219) and inner anode 425 (region A' in the electrolyte). Region A' is a cylindrical space spanning the distance between the work surface of inner anode 425 and seed layer 219. The inner diameter of the topmost portion of inner focusing cylinder 429 defines the area of a circular opening that is the virtual anode corresponding to anode 425. The area of a cross section of region A' in the electrolyte approximately corresponds to the area of inner region A on the wafer surface (see FIG. 3) depending, for example, on the distance between the inner virtual anode and seed layer 219.

Wafer holder 223 is capable of positioning wafer 221 in close proximity to the topmost portion of the inner focusing cylinder. Preferably the distance between the topmost portion of the inner focusing cylinder and the wafer is preferably between about four and ten times the thickness of the inner focusing cylinder walls during plating. Within that separation distance, resistive membrane 227 resides.

Outer focusing cylinder 431 is used (in conjunction with cylinder 429) to focus current in electrolyte 215 arising from closure of the cell circuit between the cathode (seed layer 219) and outer anode 427 (region B' in the electrolyte). Region B' is a cylindrical space spanning the distance between the work surface of outer anode 427 and seed layer 219 (minus the space encompassed by region A' and inner focusing cylinder 429). The inner diameter of the topmost portion of outer focusing cylinder 431 and the outer diameter of inner focusing cylinder 429 define the area of an annular opening that is the virtual anode for anode 427. Preferably the outer focusing cylinder has an inner diameter at its topmost portion (aperture) that approximates the diameter of the wafer being plated. Thus the area of a cross section of region B' in the electrolyte approximately corresponds to the area of outer region B on the wafer surface (see FIG. 3) depending, for example, on the distance between the outer virtual anode and seed layer 219.

In this example, the inner focusing cylinder and outer focusing cylinder are of different height, that is, their topmost portions (which define the virtual anodes as described above) are different distances away from the seed layer during plating. Also they have walls of different thickness. This is only one example. The height of the inner and outer focusing cylinders and their respective wall thicknesses can be the same or different.

In the example described in relation to FIGS. 3 and 4, distributing a plating current between a plurality of anodes means distributing the current between an inner anode, proximate to the inner region, and an outer anode, proximate to the outer region. For example, a larger percentage of the total anodic potential of a cell is applied to the inner anode in order to overcome initial higher electrical resistance levels in the inner region (vs. in the outer region). As the plated layer thickens, the terminal effect is diminished, so the relative ratio of current applied to the inner vs. the outer anode is decreased in order to more evenly distribute the electrical current density in the electrolyte proximate the inner vs. outer regions.

Figure 5A:
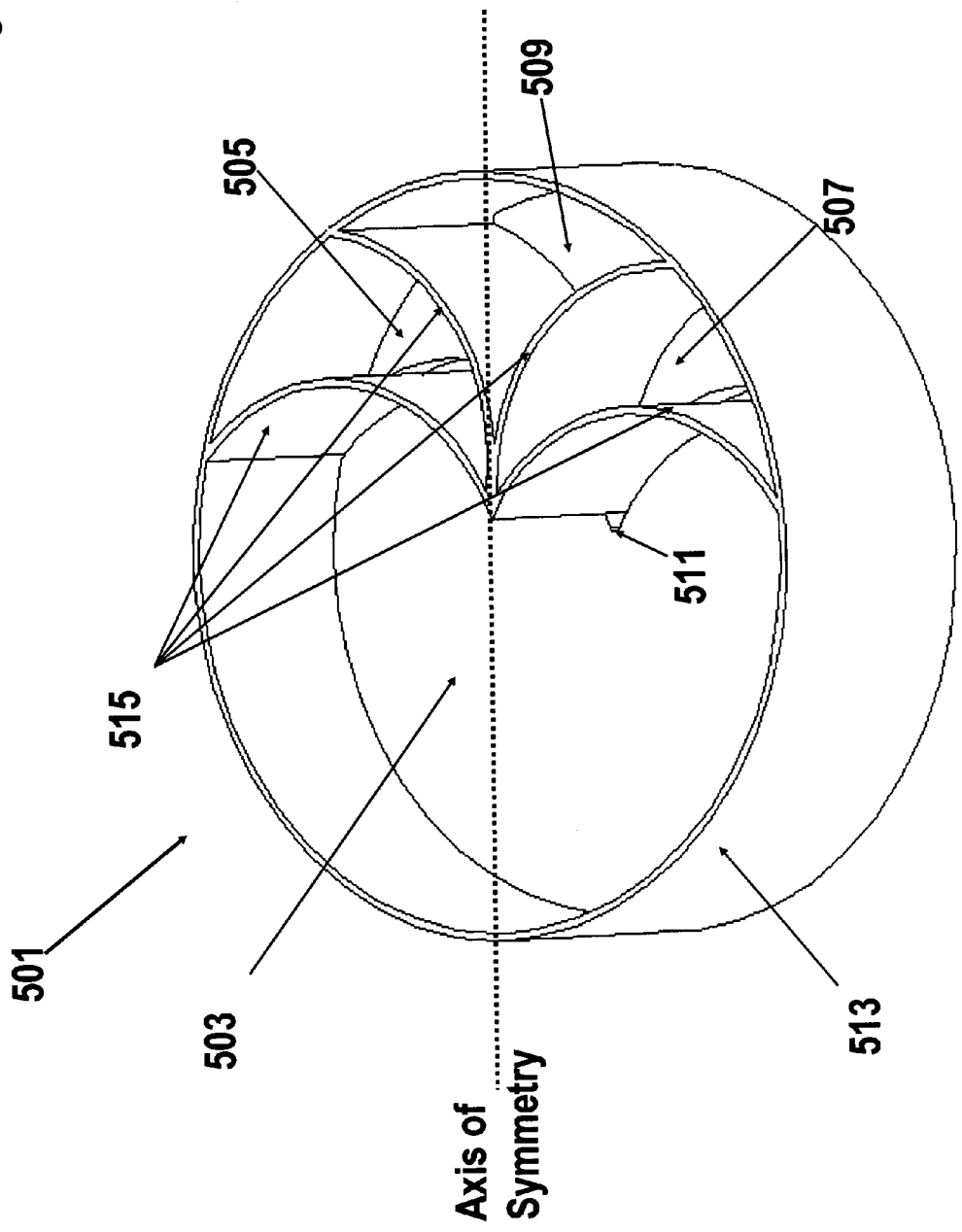
FIG. 5A is a perspective drawing of an azimuthally asymmetric anode assembly for use with some embodiments of this invention.
Figure 5B:
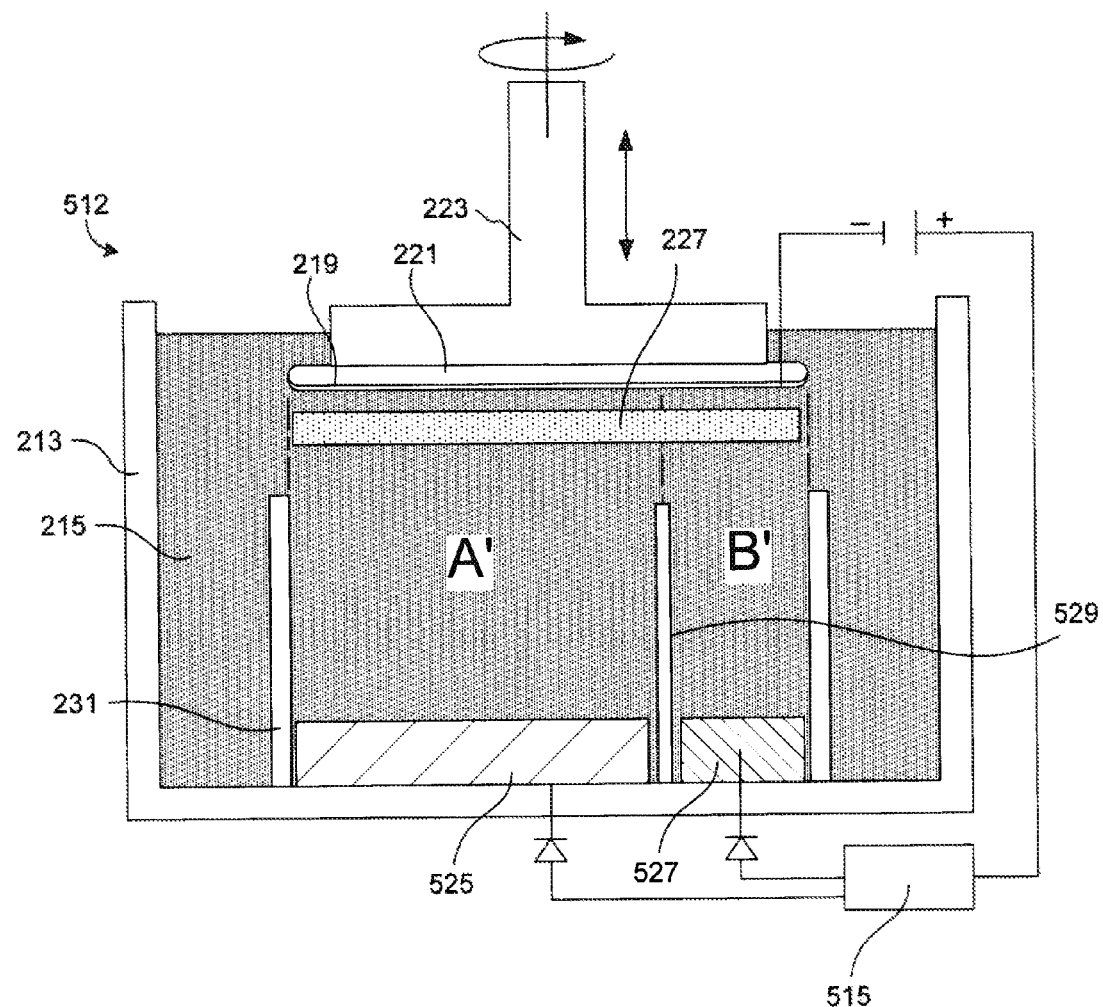
FIG. 5B is a cross-section depicting a plating cell having both a resistive membrane and an azimuthally asymmetric anode assembly in accordance with an embodiment of the invention.

FIGS. 5A and 5B present another exemplary embodiment of this invention—one that employs an azimuthally asymmetric anode in conjunction with a resistive membrane. The concept of an azimuthally asymmetric anode is most clearly understood with reference to FIG. 5A. In this design, an anode assembly 501 includes a primary azimuthally asymmetric anode 503 and multiple secondary anode segments 505, 507, and 509. The work piece, which is not shown, lies above anode assembly 501 and rotates about an axis substantially aligned with a center axis 511 of the anode assembly. In a typical embodiment, the footprint of the work piece corresponds (at least roughly) to the perimeter of anode assembly 501.

Initially, to provide a large fraction ionic current to the central region of the work piece (proximate the rotational axis), only asymmetric anode 503 is energized and provides current. The regions of assembly 501 occupied by segments 505, 507, and 509 do not provide any significant current during this initial phase of the plating process when the terminal effect is most severe. At any given instant in time, a relatively large section of the work piece periphery is not located over top of anode 503 (or otherwise aligned with any portion of anode 503). Of course, as the work piece rotates, any given point on its periphery comes over the region of anode 503 and then passes beyond it. Because a relatively large segment of the work piece periphery is out of "contact" with anode 503 at any instant in time, while much more of the central regions remains in contact, the driving force for plating from anode 503 is non-uniformly distributed over the radius of the work piece. This compensates for the terminal effect. As the plated layer grows, and the terminal effect decreases, the other anode segments can be turned on gradually.

The asymmetric anode is shaped to yield a particular time-of-exposure correction to the current distribution. As shown in the example of FIG. 5A, a portion of anode 503 is generally circular, having a constant radius from center point 511. This is the left side of the anode as shown in FIG. 5A. In the depicted example, the region of constant radius occupies nearly 180 degrees of the overall anode assembly. Beyond this region, the radius gradually decreases toward an angular position where the radius becomes zero. That is, there are no abrupt changes in radial value as one moves azimuthally. In the example at hand, this produces the heart shaped structure shown in FIG. 5A. With this design, the outer radius of the work piece will lie over top of the anode during only one-half the period of rotation. More centrally located regions of the work piece will lie over top of the anode for progressively longer periods of time.

As shown in FIG. 5A, the anode assembly is contained within a vertically extending anode chamber wall 513. In addition, the individual anode segments (including asymmetric anode 503) are isolated from one another by vertically extending anode isolator walls 515. This structure serves to produce closed isolator walls around the individual anode segments of assembly 501. Each anode segment may be electrically isolated from one another and the ionic current produced there from is confined within the closed isolator wall until reaching the top of the wall. This allows the actual anode to be significantly removed from the substrate, creating a "virtual anode" (which is much closer to the substrate) and isolating the individual anodes and limiting their interactions. The resistive membrane is located slightly above the structure defined by walls 513 and 515.

FIG. 5B is a simplified cross-section of a plating cell 512 that includes an azimuthally asymmetric anode. Plating cell 512 has various features in common with plating cell 212 shown in FIG. 2, including a vessel 213, a wafer holder 223, and a resistive element 227. A circuit 515 distributes the plating current variably to each of two anodes, a primary asymmetric anode 525 and a secondary asymmetric anode 527. In one embodiment, the work surface of the primary asymmetric anode has a surface area that corresponds to between about 60 and 95 percent of the platable surface area of the work piece to be plated. Preferably the work surface of the one or more secondary anodes has a surface area that corresponds to between about 5 and 40 percent of the platable surface area of the wafer to be plated.

In this example, anodes 525 and 527 are positioned in the bottom of vessel 213 such that there is sufficient space for vertical focusing element wall(s) 529 and an anode chamber wall 231. Anode chamber wall 529 defines a partially closed region for at least some of the focusing elements of anode segments in the anode assembly. A focusing element for the primary asymmetric anode 525 is used to focus current in electrolyte 215. Region A' is an asymmetric space spanning the distance between the work surface of anode 525 and seed layer 219. Region B' is a similar asymmetric space associated with secondary anode 527.

Preferably the work surface areas of the virtual anodes of the invention are aligned to the work surface of the seed layer on which metal is deposited to thereby provide a relatively direct current path between the anode and the work piece. In practice this means that the rotational axes or center points of the anode and work piece should be substantially aligned and the planes defined by these electrodes should be substantially parallel. Further, the outer perimeters and areas of these electrodes (possibly as traced during a single rotation) are preferably substantially similar. As indicated, the ionically resistive layer is located between the work piece and any actual or virtual anodes.

As mentioned, another compensation mechanism for the terminal effect employs a shield (or iris). It has been found that an iris acts in a generally similar fashion to the concentric anode design, but with a little less center current, a larger current excursion up to the iris edge, and then no current at all flowing over most of the iris shielded area right up the wafer edge. In a specific embodiment, a 3 inch diameter iris (3 mm thick) is located at 8 mm in front of the wafer. The presence of the iris prevents current from entering the membrane through that interface. But by creating a small gap between the resistive membrane and the iris shield, some current slips into this resistive gap and redistributes favorably (as indicated in an example discussed below).

Method

Figure 6:
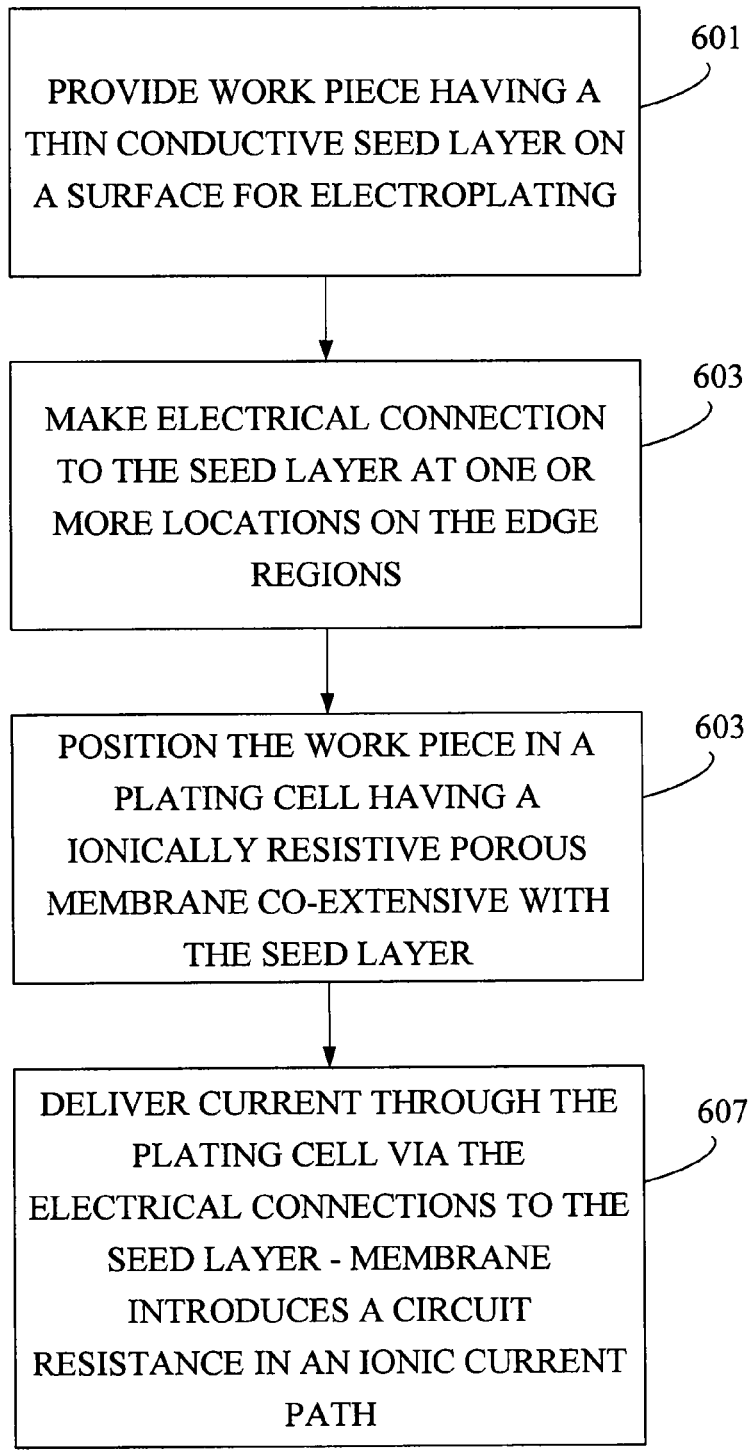
FIG. 6 is a flow chart depicting a sequence of operations in accordance with one embodiment of this invention.

FIG. 6 presents a flow chart showing an exemplary sequence of operations associated with an embodiment of this invention. The depicted method begins at a block 601 at which a work piece is provided for electroplating. The work piece has a thin conductive seed layer as described above and the work piece surface has edge regions (e.g., a circular perimeter) around a center region. Next, at a block 603, an electrical connection is made to the seed layer at one or more locations on the edge region, but not at the center region. Then, as shown at a block 605, the work piece is positioned in a plating cell having an ionically resistive porous membrane co-extensive with the seed layer. The membrane has one surface facing the work piece surface and an opposite surface facing an anode in the plating cell, such that the surface to be plated is preferably located within about 5 millimeters or less of the porous membrane. Note that the operations of blocks 603 and 605 can be reversed as may be appropriate for certain apparatus designs and applications. Finally, as indicated at a block 607, current is delivered through the plating cell via the electrical connections to the seed layer. While the current flows, the membrane introduces a circuit resistance in the ionic current path of the plating cell, which compensates for a potential drop in the seed layer between edge regions and the center regions to thereby promote uniform plating across the seed layer on the work piece surface.

In certain applications (most notably IC fabrication), the work piece is substantially flat and circular, and it is located in the plating cell such that its surface is separated from the membrane by a distance of not greater than about 5% of the diameter of the work piece's circular region (more preferably not greater than about 2%). Preferably the method and apparatus are designed such that the presence of the porous membrane increases the ionic resistance between the anode and the work piece by no more than about 10 ohms when the work piece is a 200 or 300 millimeter semiconductor wafer.

As indicated above, the operation of delivering current through the plating cell may involve delivering current through two separate anode segments, controlled independently of one another. The anode segments may be concentrically or non-concentrically arranged with respect to one another. Further the segments may be rotationally/azimuthally symmetric or asymmetric. Further the current distribution may be shaped by one or more shielding elements in addition to the porous membrane.

Experimental

Figure 7:
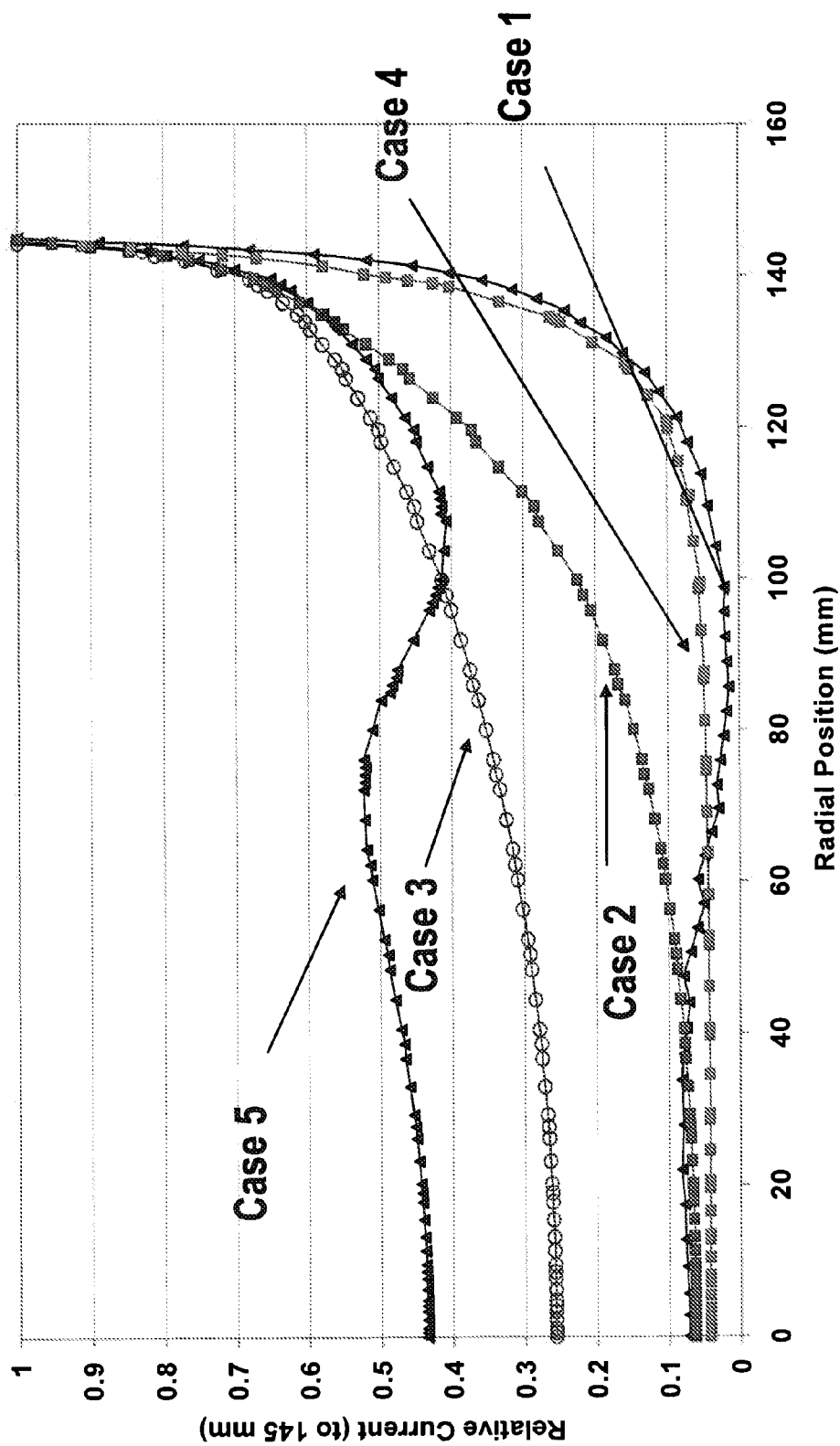
FIG. 7 is a graph showing five cases for investigating the effects of placing a resistive membrane in front of a wafer with a resistive film.

FIG. 7 shows five cases for investigating the effects of placing a resistive membrane in front of a wafer with a resistive film (e.g., a seed layer). Each case was generated using a computer model current distribution simulation of plating on a 300 mm wafer with a very thin resistive seed (sheet resistance 40 ohm/sq) and various hardware configurations. The bath resistivity for the simulations was set to 0.5 ohm-cm. The simulation accounts for field effects in the electrolyte and the wafer. The anode was assumed to be an infinitely conductive constant potential current source, and no surface charge transfer or diffusion resistances were considered.

Case 1 in FIG. 7 is a baseline case in which no membrane was employed. The system resistance this case is small (0.70 ohm), but the current distribution is extremely non-uniform (the radial current distribution is shown in FIG. 7, labeled case 1). Note that in FIG. 7, the center of the wafer is represented by 0 mm and the edge of the wafer is represented by 150 mm. The average current during plating was 6.875 A.

In the next case, labeled as case 2, a 5 mm thick membrane (5% porosity) is placed 3 millimeters below and parallel to the wafer. Note that porosity is represented in these simulations as the fractional superficial conductance of the membrane region with respect to the specific conductance of the electrolyte within the membrane. In this case, the system resistance is increased to only about 1.23 ohm and the amount of center current (8%). Furthermore, the shape of the response curve for this case is generally monotonic, with more current in the radial regions from 60 mm and beyond. In this example, the anode potential was set to 8.5 V with respect to the cathode which yielded an average current of 6.875 A.

Increasing the thickness of the membrane to 25 mm (case 3 in FIG. 7) greatly improves the uniformity and increases the center current, with a corresponding system resistance of only 2.5 ohms. Therefore, one can conclude that this approach of using a resistive membrane in close proximity to the wafer is quite effective. In case 3, the membrane again has 5% porosity and is separated from the wafer surface by 3 mm. The anode potential was set to 17 V, which yielded an average current of 6.875 A.

Note that, as one increases the distance between the membrane and the plated interface from 3 to 30 mm, the uniformity progressively worse, but the system resistance decreases only marginally, to 2.0 ohms. This situation is represented in case 4 in FIG. 7. So in some preferred embodiments, the membrane will be placed as close to the wafer as is practicable. In case 4, the membrane has 5% porosity and is 25 mm thick. The anode potential was set to 14 V, which yielded an average current of 6.875 A.

As explained above, it may be desirable to employ multiple concentric anodes in conjunction with the resistive membrane. Case 5 in FIG. 7 simulates a plating cell with concentric anodes and having a 25 mm thick resistive membrane (5% porosity) separated from the wafer surface by 3 mm. This may be implemented by using electrically and ionically insulating focusing cylinders that mate with the lower surface of the membrane. In the depicted embodiment, two anodes are employed: an inner anode having a radius of approximately 9 centimeters mm and an outer concentric anode having a radius of approximately 15 centimeters. The potential applied to the center anode is 12.5 V and that applied to the outer anode is 8.0 V versus the potential of the cathode. These potentials are continuously applied to the anodes and the inner anode is not charged first. As shown in FIG. 7, this case results in significantly more current being directed to the center of the wafer, although the current distribution no longer grows monotonically from the center to edge of the wafer.

Figure 8:
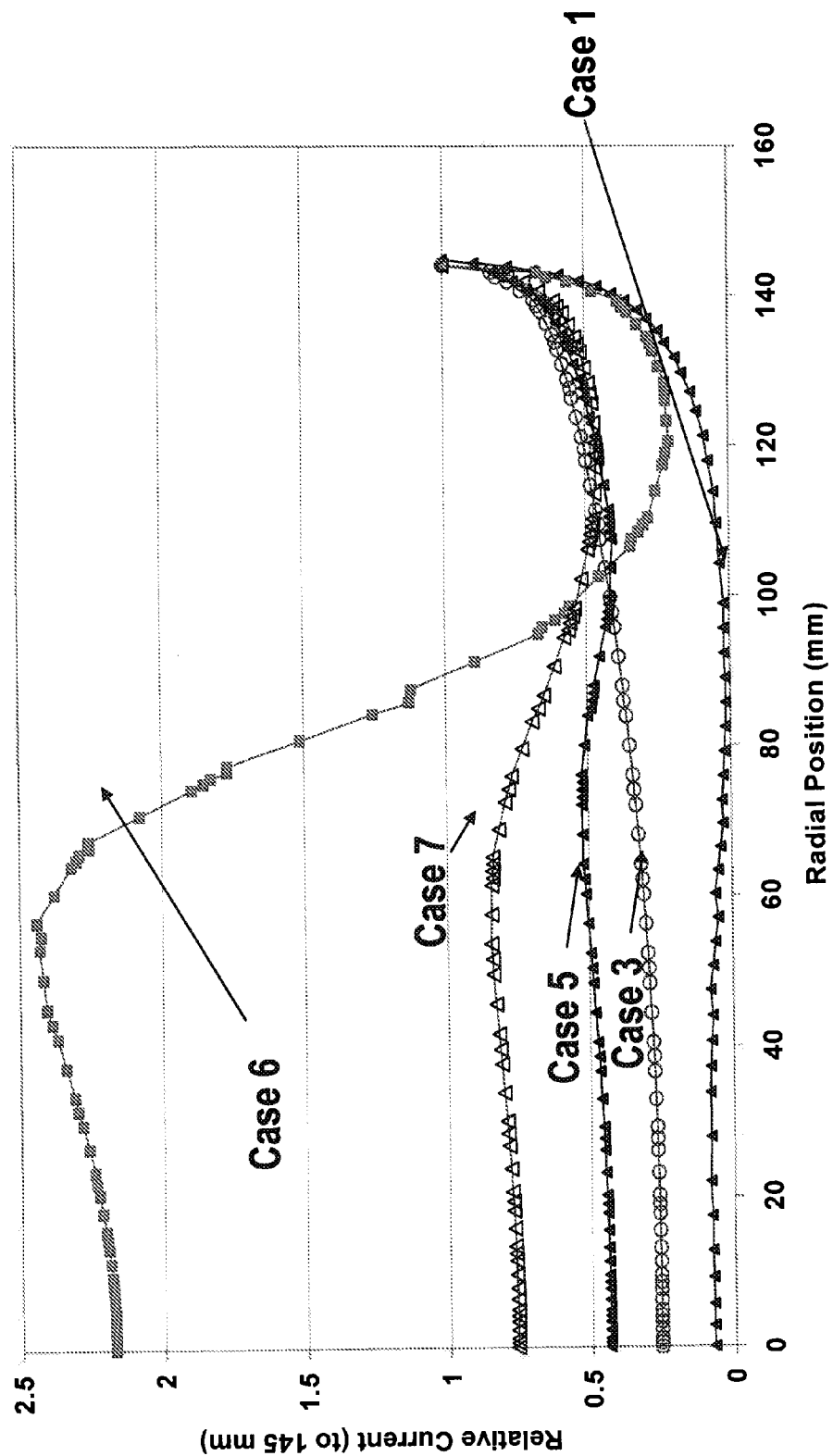
FIG. 8 is a graph showing an additional two cases for investigating the effects of placing a resistive membrane in front of a wafer with a resistive film.

Another method and means of accomplishing a similar effect is to use a dynamically variable field-shaping element placed below the membrane. FIG. 8 shows two additional cases employing irises that blocked at least some ionic current in the outer region of the wafers.

In a case 6, the cell had a 3 inch diameter iris opening placed between the resistive membrane and the anode, and touching the lower face of the membrane. The presence of the iris prevented current from entering the membrane through that interface. FIG. 8 shows the radial current distribution predicted for this arrangement (curve labeled case 6). Much of the current is directed into the center, though the distribution is varies quite widely and the system resistance is very high. However, by creating a small gap between the membrane and the shield (iris), some current can slip into this resistive gap and redistribute the current favorably (see case 7 in FIG. 8). The system resistance for this case is also greatly reduced with respect to case 6 (4.5 ohm vs. 7.4 ohm). Therefore, one can tune the distribution very effectively and dynamically by varying the distance of the shielding element between the membrane and the distance between the membrane and the wafer.

In the simulations of cases 6 and 7, the iris was 3 mm thick and stationary, with the 3 inch diameter extending from the outer edge of the wafer (radial position 150 mm) inwardly to a radial position 3 inches toward center of the 150 mm edge. The membrane had 5% porosity and 25 mm thickness. Its top face was located 3 mm from the wafer plating surface. In both cases, the anode potential was set to 51 V, which yielded an average current of 6.875 A.

CONCLUSION

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of electroplating a layer of metal onto a thin conductive seed layer of a work piece surface having edge regions around a center region, the method comprising:
   a. making electrical connection to the seed layer at one or more locations on the edge regions, but not at the center region;
   b. positioning the work piece in a plating cell having an ionically resistive ionically permeable element, configured to improve plating uniformity, wherein the ionically resistive ionically permeable element has a porosity of 5% or less, a thickness of between about 5 and 25 millimeters, and wherein the element is positioned to have one surface facing the work piece surface, and located within about 5 millimeters of said work piece surface when the work piece is held in a plating position by a work piece holder; and
   c. delivering current through the plating cell via the electrical connections to the seed layer to electroplate the layer of metal on the seed layer, whereby the ionically resistive ionically permeable element introduces a circuit resistance in an ionic current path of the plating cell and at least partially compensates for a potential drop in the seed layer between edge regions and the center regions thereby promoting uniform plating across the seed layer on the work piece surface.

2. The method of claim 1, wherein the surface to be plated is located within about 1 to 5 millimeters of the surface of the ionically resistive ionically permeable element facing the work piece.

3. The method of claim 1, wherein the surface of the work piece is substantially flat and circular, and wherein the surface is separated from the ionically resistive ionically permeable element by a distance of not greater than about 5% of the diameter of the work piece's circular region.

4. The method of claim 1, wherein the work piece surface is separated from the ionically resistive ionically permeable element by a distance of not greater than about 2% of diameter of the work piece's circular region.

5. The method of claim 1, wherein (c) comprises delivering current through the plating cell comprising delivering current through two separate anode segments, controlled independently of one another.

6. The method of claim 5, wherein the anode segments are arranged concentrically with respect to one another.

7. The method of claim 5, wherein at least one anode segment is azimuthally asymmetric with respect to the work piece surface and wherein the azimuthally asymmetric anode segment is rotated about an axis substantially perpendicular to the work piece surface while delivering current to the plating cell.

8. The method of claim 1, wherein the plating cell comprises an iris positioned to restrict ionic current proximate the edge regions of the work piece surface, wherein the iris is configured to be movable during electroplating.

9. The method of claim 1, wherein the work piece is a semiconductor wafer and the seed layer covers a front side work surface of the wafer on which copper is plated while delivering current through the plating cell.

10. The method of claim 1, wherein the work-piece is held in a face down orientation.

11. The method of claim 1, wherein the ionically resistive ionically permeable element is positioned such that it does not contact an anode during plating.

12. The method of claim 1, wherein the plating cell comprises an anode having at least two separate anode segments controllable independently of one another, wherein the plating cell further comprises an insulating focusing wall around at least one of the anode segments, wherein the wall is configured to confine ionic current from said anode segment and to limit interactions between anode segments.

13. The method of claim 12, wherein the insulating focusing wall extends from the anode segment to the ionically resistive ionically permeable element and contacts the element.

14. A method of electroplating a layer of metal onto a thin conductive seed layer of a work piece surface having edge regions around a center region, the method comprising:

a) making electrical connection to the seed layer at one or more locations on the edge regions, but not at the center region;
b) positioning the work piece in a plating cell having an ionically resistive ionically permeable element, configured to improve plating uniformity, wherein the ionically resistive ionically permeable element has a porosity of 5% or less, a thickness of between about 5 and 25 millimeters, and wherein the surface of the work piece is substantially flat and circular and wherein the surface is separated from the ionically resistive ionically permeable element by a distance of not greater than about 5% of the diameter of the work piece's circular region; and
c) delivering current through the plating cell via the electrical connections to the seed layer to electroplate the layer of metal on the seed layer, whereby the ionically resistive ionically permeable element introduces a circuit resistance in an ionic current path of the plating cell and at least partially compensates for a potential drop in the seed layer between edge regions and the center regions thereby promoting uniform plating across the seed layer on the work piece surface.

15. The method of claim 14 wherein the work piece surface is separated from the ionically resistive ionically permeable element by a distance of not greater than about 2% of diameter of the work piece's circular region.

16. The method of claim 14, wherein (c) comprises delivering current through the plating cell comprising delivering current through two separate anode segments, controlled independently of one another.

17. The method of claim 14, wherein the plating cell comprises an iris positioned to restrict ionic current proximate the edge regions of the work piece surface, wherein the iris is configured to be movable during electroplating.

* * * * *